(12) United States Patent
Kozawa et al.

(10) Patent No.: US 8,906,598 B2
(45) Date of Patent: Dec. 9, 2014

(54) PATTERN FORMING METHOD, METHOD FOR MANUFACTURING SEMICONDUCTOR DEVICE, AND MATERIAL FOR FORMING COATING LAYER OF RESIST PATTERN

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 13/168,472

(22) Filed: Jun. 24, 2011

(65) Prior Publication Data

US 2011/0250541 A1 Oct. 13, 2011

Related U.S. Application Data

(63) Continuation of application No. PCT/JP2008/073809, filed on Dec. 26, 2008.

(51) Int. Cl.
| | |
|---|---|
| G03F 7/20 | (2006.01) |
| G03F 7/40 | (2006.01) |
| H01L 21/027 | (2006.01) |
| G03F 7/00 | (2006.01) |
| H01L 21/311 | (2006.01) |
| H01L 21/768 | (2006.01) |

(52) U.S. Cl.
CPC ............ *G03F 7/0035* (2013.01); *G03F 7/40* (2013.01); *H01L 21/0273* (2013.01); *H01L 21/31144* (2013.01); *H01L 21/76816* (2013.01)
USPC .......................................... 430/322

(58) Field of Classification Search
USPC .......... 430/322, 323, 324, 311, 313, 314, 394
See application file for complete search history.

(56) References Cited

U.S. PATENT DOCUMENTS

| | | | | |
|---|---|---|---|---|
| 4,719,502 A | * | 1/1988 | Ikeya et al. | 257/793 |
| 2006/0063871 A1 | * | 3/2006 | Taylor et al. | 524/300 |

(Continued)

FOREIGN PATENT DOCUMENTS

| | | |
|---|---|---|
| CN | 1821871 A | 8/2006 |
| CN | 1975571 A | 6/2007 |

(Continued)

OTHER PUBLICATIONS

Chinese Office Action dated Nov. 12, 2012, issued in corresponding Chinese PAtent Application No. 200880132520.0, (14 pages). With Partial English Translation.
Japanese Office Action dated Nov. 20, 2012, issued in corresponding Japanese Patent Application No. 2010-543722, (7 pages). With Partial English Translation.
Abdallah, David J. et al "A Novel Resist Freeze Process for Double Imaging," Journal of Photopolymer Science and Technology, 2008, vol. 21 No. 5, pp. 655-663.

(Continued)

*Primary Examiner* — Brittany Raymond
(74) *Attorney, Agent, or Firm* — Westerman, Hattori, Daniels & Adrian, LLP

(57) ABSTRACT

To provide a pattern forming method, which contains: forming a first resist pattern on a processing surface using a first resist composition; forming a coating layer using a coating material so as to cover a surface of the first resist pattern; applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern to the air, as well as forming a second resist pattern in an area of the processing surface where the first resist pattern has not been formed.

9 Claims, 6 Drawing Sheets

(56) References Cited

U.S. PATENT DOCUMENTS

| | | | |
|---|---|---|---|
| 2006/0188805 A1* | 8/2006 | Nozaki et al. | 430/270.1 |
| 2007/0123623 A1* | 5/2007 | Kozawa et al. | 524/318 |
| 2007/0287101 A1* | 12/2007 | Kim et al. | 430/313 |
| 2008/0044770 A1 | 2/2008 | Nozaki et al. | |
| 2008/0073322 A1 | 3/2008 | Nozaki et al. | |
| 2010/0003622 A1 | 1/2010 | Matsumaru et al. | |
| 2010/0035177 A1 | 2/2010 | Ishikawa et al. | |
| 2010/0323292 A1 | 12/2010 | Nakamura et al. | |

FOREIGN PATENT DOCUMENTS

| | | |
|---|---|---|
| CN | 101126895 A | 2/2008 |
| JP | 2006-259692 A | 9/2006 |
| JP | 2007-148272 A | 6/2007 |
| JP | 2008-033174 A | 2/2008 |
| JP | 2008-083537 A | 4/2008 |
| JP | 2008-107788 A | 5/2008 |
| JP | 2010-145537 A | 7/2010 |
| WO | 2008/114644 A1 | 9/2008 |

OTHER PUBLICATIONS

Bekiaris, Nikolaos et al. "A Lithographic and Process Assessment of Photoresist Stabilization for Double-Patterning using 172 nm Photoresist Curing," Advances in Resist Materials and Processing Technology XXV, Proc. of SPIE, 2008, vol. 6923, 692321.

Chen, Kuang-Jung Rex et al. "Resist Freezing Process for Double Exposure Lithography," Advances in Resist Materials and Processing Technology XVX, Proc. of SPIE, 2008, vol. 6923, 69230G.

Hori, Masafumi et al "Sub-40nm Half-Pitch Double Patterning with Resist Freezing Process," Advances in Resist Materials and Processing Technology XXV, Proc. of SPIE, 2008, vol. 6923, 69230H.

Wiaux, Vincent et al "Split and Design Guidelines for Double Patterning," Optical Microlithography XXI, Proc. of SPIE, 2008, vol. 6924, 692409.

International Search Report of PCT/JP2008/073809, mailing date Mar. 31, 2009.

Office Action dated Jul. 3, 2014, issued in corresponding Chinese Patent Application No. 201310078760.X, with English Translation (15 pages).

* cited by examiner

PATTERN FORMING METHOD, METHOD FOR MANUFACTURING SEMICONDUCTOR DEVICE, AND MATERIAL FOR FORMING COATING LAYER OF RESIST PATTERN

CROSS-REFERENCE TO RELATED APPLICATIONS

This application is a continuation of PCT/JP2008/073809, filed on Dec. 26, 2008, the entire contents of which are incorporated herein by reference.

FIELD

The embodiments discussed herein are related to a pattern forming method, a method for manufacturing a semiconductor device using the pattern forming method, and a material for forming a coating layer of a resist pattern.

BACKGROUND

To further improve integration degrees of semiconductors such as of a large scale integration (LSI), finer patterns are made during productions of semiconductors, and currently the smallest pattern size is as small as 45 nm.

The formation of fine patterns in such semiconductor devices can be realized by the exposure technique using electron beams that are capable of forming fine pattern in the size of 100 nm or smaller. The exposure technique using electron beams has a low throughput, and therefore it is not suitable for manufacturing at low cost. Therefore, it has been considered that exposure techniques not using electron beams be developed to shorten wavelength of light from a light source in an exposure device (e.g., Extreme Ultraviolet (EUV) exposure using soft X-rays having a wavelength of 13.5 nm as a light source). However, to shortening light from a light source in the exposure device means to update the exposure device. A considerable cost is expected to carry out this update. Moreover, to form a fine pattern, it is expected that a resist material is developed to have a high resolution corresponding to the light source of the exposure device, but developments of resist materials have limitations and thus it is difficult to provide a resist material having all of the desired characteristics. Therefore, it is desired to take a totally different approach to provide a technology capable of forming a fine resist pattern uniformly and highly accurately without updating exposure devices or developing resist materials.

There is a method called, liquid immersion lithography, as a method for forming a fine resist pattern exceeding exposure limit (resolution limit) of an exposure light source using a conventional exposure device.

The liquid immersion lithography is a method for achieving high resolution by filling a space between a resist and a final projection lens with a liquid having the higher refractive index than that of air. However, resolution of a resist in this liquid immersion is still insufficient, and precise processing for giving a half pitch (hp) of 32 nm, which is regarded as a half pitch of the next generation, cannot be easily performed by the liquid immersion lithography.

Under such circumstances, a double patterning method has recently attracted people's attentions as a technique capable of precision processing to give the 32 nm-half pitch (hp) of the next generation (see, for example, Optical Microlithography XXI, Proc. SPIE, 6924, 6924-8(2008)). This double patterning method is a method to reduce a pitch of the resist pattern by forming a first resist pattern, and forming a second resist pattern in the space formed by the first resist pattern so as to be adjacent to be the first resist pattern. Among the double patterning pattern methods known, the method called Litho Litho Etch (LLE) is particularly advantageous in terms of the cost, and LLE is a method in which a second resist film is developed without etching a first resist film, which has been developed. This LLE is, for example as illustrated in FIGS. 1A to 1D, to form a resist pattern of 100 nm-line (L)/100 nm-space (S) (1:1) (FIG. 1D)), by exposing a first resist film 1 through a certain mask pattern, and developing (FIG. 1A) to form a first resist pattern 2 of 100 nm-line (L)/300 nm-space (S) (1:3) (FIG. 1B); applying a second resist 3 over the first resist pattern 2; and exposing through the same mask pattern sifted from the line pattern of the first resist pattern 2 by 200 nm, and developing (FIG. 1C) to form a second resist pattern 4 as well as exposing the first resist pattern 2 to the air. Since the second resist 3 is applied without dissolving the first resist pattern 2 in this double patterning method, a technique called "resist freezing" that inactivates the first resist pattern 2 in some way is used.

As the resist freezing technique, for example, a technique for applying a short wavelength-ultraviolet rays of 172 nm has been known (see, for example, Advances in Resist Materials and Processing Technology XXV, Proc. SPIE, 6923, 6923-79(2008)). This technique, however, includes a special process which is different from common resist exposure, and thus there are problems that turn around time (TAT) becomes long, practices using the technique is unrealistic, and it is not suitable for productions at low cost.

As another example of the resist freezing technique, a technique using high temperature heating has been known (see, for example, Advances in Resist Materials and Processing Technology XXV, Proc. SPIE, 6923, 6923-16(2008)). This technique, however, can use only the resist material (particularly a resin) that can resist high temperature heating, and therefore it has problems such that variations of the resist materials which can be used are poor, and it is not suitable for productions at low cost.

As yet another example of the resist freezing technique, a technique using a freezing agent containing a crosslinking agent has been known (see, for example, Advances in Resist Materials and Processing Technology XXV, Proc. SPIE, 6923, 6923-17(2008)). This technique, however, causes uneven covering of the resist pattern in the case where there is a difference in densities of the resist pattern, such as in the case of Logic LSI, or different shapes of the resist pattern are present together, and thus there is a problem that it is difficult to form a precise pattern using this technique.

As yet another example of the resist freezing technique, a technique for processing with amine gas has been known (see, for example, J. Photopolym. Sci. Tecnol., 21(5), 655-663 (2008)). However, this technique has problems that sensitivity of the resist may decreases, or the residue may be remained as the second resist is poisoned (i.e. resist poisoning) by this process.

As yet another example of the resist freezing technique, a technique using a freezing agent containing a water-soluble resin and a water-soluble crosslinking agent has been known (see, for example, Japanese Patent Application Laid-Open (JP-A) No. 2008-83537). However, a coating layer formed by this technique has low transmissiveness against ArF excimer laser light of 193 nm, and thus there is a problem that the first resist pattern is exposed to the air again and dissolves to a developing solution.

As yet another example of the resist freezing technique, a technique using a freezing agent containing a metal compound has been known (see, for example, JP-A No. 2008-33174). However, this technique creates a big difference in etching resistance between the first resist pattern to which the coat layer has been formed and the second resist pattern, and thus there is a problem that it is difficult to secure a process margin.

As mentioned above, the double patterning method using the conventional resist freezing technique has problems that it is difficult to form a precise resist pattern capable of forming a precise pattern at high through put and low cost.

Note that, there has already been disclosed a resist pattern thickening material, which can use ArF excimer laser light for exposure, can thicken a resist pattern without depending on a size of the resist pattern, and can easily and efficiently form a fine pattern and the like using the resist pattern by exceeding the exposure limit (see, for example, JP-A Nos. 2006-259692, 2007-148272, and 2008-107788). However, this material is not expected to be used in the double patterning method.

SUMMARY

According to an aspect of the invention, a pattern forming method includes:

forming a first resist pattern on a processing surface using a first resist composition;

forming a coating layer using a coating material so as to cover a surface of the first resist pattern;

applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern to the air, as well as forming a second resist pattern in an area of the processing surface where the first resist pattern has not been formed.

According to another aspect of the invention, a method for manufacturing a semiconductor device includes:

forming a first resist pattern on a processing surface using a first resist composition;

forming a coating layer using a coating material so as to cover a surface of the first resist pattern;

applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern, as well as forming a second resist pattern in an area of the processing surface where the first resist pattern has not been formed.

According to another aspect of the invention, a material for forming a coating layer includes:

a phenol resin, or polyvinyl pyrrolidone, or both thereof; and a compound expressed by the following general formula 1;

General Formula 1

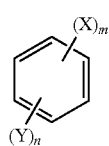

where X is a functional group expressed by the following structural formula 1; Y is a hydroxyl group, an alkoxyl group, an alkoxycarbonyl group, or an alkyl group; m is an integer of 1 or larger, and in the case where m is 2 or larger, a plurality of Xs may be the same or different from each other; and n is an integer of 0 to 3, and in the case where n is 2 or 3, two or three Ys may be the same or different from each other;

Structural Formula 1

where $R^1$ and $R^2$, which may be the same or different, are each independently a hydrogen atom or a substituent; and Z is a hydroxyl group or an alkoxy group, and wherein the coating layer is formed over a surface of a first resist pattern, and is used in a method comprising:

applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern, as well as forming a second resist pattern in an area of the processing surface where the first resist pattern has not been formed.

According to another aspect of the invention, a material for forming a coating layer includes:

a water-soluble resin; and a compound expressed by the following general formula 2 or 3:

General Formula 2

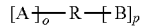

where R is an aromatic hydrocarbon compound; A is a monovalent organic group having a carboxyl group; B is a hydroxyl group, an alkyl group, an alkoxy group, or an alkoxycarbonyl group; o is an integer of 1 or larger, and in the case where o is 2 or larger, a plurality of As may be the same or different from each other; and p is an integer of 0 to 3, and in the case where p is 2 or 3, two or three Bs may be the same or different from each other, General Formula 3

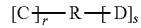

where R is an aromatic hydrocarbon compound; C is a functional group expressed by the following structural formula 1; D is a hydroxyl group, an alkoxy group, an alkoxycarbonyl group, or an alkyl group; r is an integer of 1 or larger, and in the case where r is 2 or larger, a plurality of Cs may be the same or different from each other; and s is an integer of 0 to 3, and in the case where s is 2 or 3, two or three Ds may be the same or different from each other, Structural Formula 1

where $R^1$ and $R^2$, which may be the same or different, are each independently a hydrogen atom or a substituent; and Z is a hydroxyl group or an alkoxy group, and wherein the coating layer is formed over a surface of a first resist pattern, and is used in a method comprising:

applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern, as well as forming a second resist pattern in an area of the processing surface where the first resist pattern has not been formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Figure 1A:
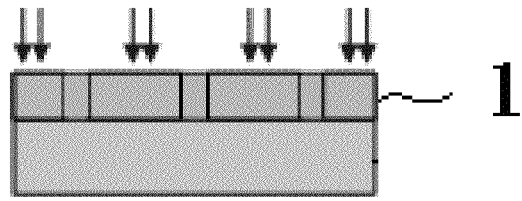
FIG. 1A is a schematic diagram for explaining one example of the conventional double-patterning method, and illustrates the state where a first resist is subjected to exposure.
Figure 1B:
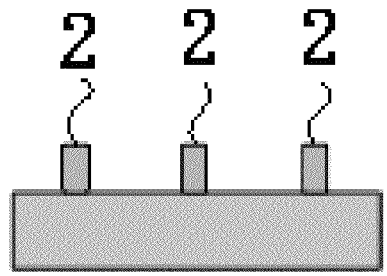
FIG. 1B a schematic diagram for explaining one example of the conventional double-patterning method, and illustrates the state where a first resist pattern is formed.
Figure 1C:
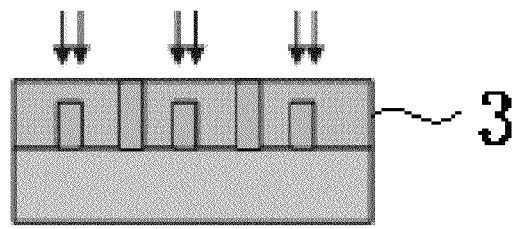
FIG. 1C is a schematic diagram for explaining one example of the conventional double-patterning method, and illustrates the state where a second resist is subjected to exposure.
Figure 1D:
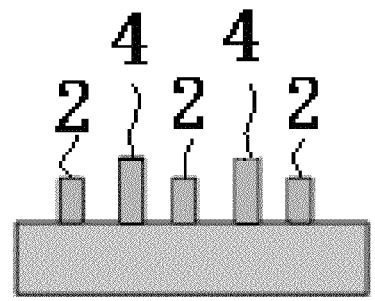
FIG. 1D is a schematic diagram for explaining one example of the conventional double-patterning method, and illustrates the state where a second resist pattern is formed.

DESCRIPTION OF EMBODIMENTS (Pattern Forming Method and Method for Manufacturing Semiconductor Device)

A pattern forming method includes at least a first resist pattern forming step, a coating layer forming step, and a second resist pattern forming step, and my further contain other steps, if necessary.

A method for manufacturing a semiconductor device includes at least a first resist pattern forming step, a coating layer forming step, and a second resist pattern forming step, and may further contain other steps, if necessary.

In accordance with the method for manufacturing a semiconductor device, a first resist pattern is formed on a processing surface using a first resist composition in the first resist pattern forming step; a coating layer is formed to cover a surface of the first resist pattern using a coating material in the coating layer forming step; and, in the second resist pattern forming step, a second resist composition is applied over the first resist pattern above which the coating layer has been formed so as not to dissolve the first pattern with the second resist composition to thereby form a second resist film, the second resist film is selectively exposed to exposure light and developed to thereby expose the first resist pattern to the air, as well as forming a second resist pattern in an area of the processing surface where the first resist pattern has not been formed. The coating layer formed of the coating material absorbs the exposure light. Therefore, in this method, the first resist pattern is prevented from being exposed again as the coating layer absorbs the exposure light applied to the second resist pattern formed of the second resist composition.

First Resist Pattern Forming Step

The first resist pattern forming step is forming a first resist pattern on a processing surface using a first resist composition.

The first resist pattern may be formed in accordance with any of the conventional methods (e.g. an exposure method, and a nanoprint method).

The first resist composition is appropriately selected from conventional resist materials without any restriction, and is negative or positive. Preferable examples thereof include an ArF resist that can be patterned by ArF excimer laser light. These resist materials may be of chemical amplified, or chemical non-amplified.

Specific examples of the first resist composition include: alicyclic resists for use in ArF excimer laser exposure, such as an acryl resist having an adamantyl group in a side chain, a cycloolefin-maleic anhydride (COMA) resist, a cycloolefin resist, a hybrid (e.g. an alicyclic acryl-COMA copolymer) resist. These may be modified with fluorine.

Moreover, a top coat may be applied on the first resist film formed of the first resist composition to carry out liquid immersion lithography. Alternatively, a liquid immersion ArF resist may be used.

The forming method, size, thickness, and the like of the first resist pattern are appropriately selected depending on the intended purpose without any restriction. The thickness thereof can be appropriately determined depending on a processing surface which is a target for processing, etching conditions, and the like, but it is generally in the approximate range of 1.00 nm to 700 nm.

The first resist pattern may be formed on a processing surface (a base), and the processing surface (the base) is appropriately selected depending on the intended purpose without any restriction. In the case where the resist pattern is formed for an electronic device such as a semiconductor device, examples of the processing surface (the base) include a surface of a semiconductor base. In the case where the resist pattern is used for productions of a magnetic head and the like, examples of the processing surface (the base) include a surface of an alloy substrate, and specific examples thereof include surfaces of substrates such as silicon wafer and AlTiC wafer, and surfaces of various oxide films.

Coating Layer Forming Step

The coating layer forming step is forming a coating layer so as to cover a surface of the first resist pattern using a coating material.

The coating material is appropriately selected depending on the intended purpose without any restriction, and preferable examples thereof include a first coating material containing a resin component (i), and a compound expressed by the following general formula 1, and a second coating material containing a resin component (ii), and a compound expressed by the following general formula 2 or 3.

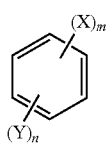

General Formula 1

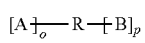

General Formula 2

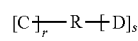

General Formula 3

First Coating Material

The first coating material contains at least a resin component and a compound expressed by the general formula 1, and may further contains an appropriately selected surfactant, organic solvent, and other components.

The resin component is a resin that can be a base material of the coating material, and may be referred to as "a base resin" hereinafter.

Base Resin

The base resin is appropriately selected depending on the intended purpose without any restriction, and examples thereof include; phenol resins such as polyparahydroxystyrene and novolac resins; polyvinyl pyrrolidone; a styrene-maleic acid copolymer; alkyd resin; and a mixture thereof. Among them, polyparahydroxystyrene is preferable as the base resin for use, because it can be used together with a wide varieties of solvents or reagents for forming a coating layer.

Compound Expressed by General Formula 1

The compound expressed by the general formula 1 is appropriately selected depending on the intended purpose without any restriction, provided that the compound has an aromatic ring at part of the structure thereof, and is expressed by the following general formula 1. Since the compound expressed by the general formula 1 has the aromatic ring, the compound can absorb exposure light (e.g. ArF light) applied to a second resist film formed of a second resist composition, which be explained later, even when the resin does not have a cyclic structure at part of the molecular structure thereof. Accordingly, use of such compound is advantageous.

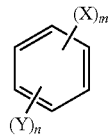

General Formula 1

In General Formula 1, X is a functional group expressed by the following structural formula 1.

Y is a hydroxyl group, an alkoxy group, an alkoxycarbonyl group, or an alkyl group.

Examples of the alkoxy group include a C1-C6 straight or blanched alkoxy group such as a methoxy group, an ethoxy group, a propoxy group, an isopropoxy group, a butoxy group, and a hexyloxy group.

Examples of the alkoxycarbonyl group include a C1-C6 straight or blanched alkoxycarbonyl group such as a methoxycarbonyl group, an ethoxycarbonyl group, a n-propoxycarbonyl group, an isopropoxycarbonyl group, a n-butoxycarbonyl group, an isobutyloxycarbonyl group, and a tert-butyloxycarbonyl group.

Examples of the alkyl group include a C1-C6 straight or blanched alkyl group such as a methyl group, an ethyl group, a n-propyl group, an isopropyl group, is a n-butyl group, an isobutyl group.

"m" is an integer of 1 or larger, and in the case where m is 2 or larger, a plurality of Xs may be the same or different to each other.

"n" is an integer of 0 to 3, and in the case where n is 2 or 3, two or three Ys may be the same or different to each other.

Structural Formula 1

In the structural formula 1, $R^1$ and $R^2$, which may be the same or different, are each independently a hydrogen atom or a substituent; and Z is a hydroxyl group or an alkoxy group.

Examples of the alkoxy group include a C1-C6 straight or blanched alkoxy group such as a methoxy group, an ethoxy group, an isopropoxy group, a butoxy group, and a hexyloxy group.

In the structural formula 1, $R^1$ and $R^2$ are both preferably hydrogen atoms. When $R^1$ and $R^2$ are hydrogen atoms, they often provide desirable water-solubility to the resulting coating material.

In the case where $R^1$ and $R^2$ in the structural formula 1 are the substitutents, these substituents are appropriately selected depending on the intended purpose without any restriction. Examples thereof include a ketone (alkylcarbonyl) group, an alkoxycarbonyl group, and an aklyl group.

Specific examples of the compound expressed by the general formula 1 include a compound having a benzyl alcohol structure.

The compound having a benzyl alcohol structure is appropriately selected depending on the intended purpose without any restriction, and examples thereof include benzyl alcohol, 2-hydroxybenzyl alcohol (salicyl alcohol), 4-hydroxybenzyl alcohol, 2,4-dihydroxylbenzyl alcohol, 1,4-benzene dimethanol, 1,3-benzene dimethanol, 1-phenyl-1,2-ethanediol, and 4-methoxymethylphenol.

These may be used independently or in combination.

The benzylamine derivative, which has the similar structure to the benzyl alcohol structure, does not have a problem for forming a coating layer, but the problem known as resist poisoning, in which a protective group elimination reaction induced by an acid present in the resist is inhibited, tends to occur at the time of forming the second resist pattern. Therefore, for use of the benzyl amine derivative, it would be ideal to pay attention, such as reducing an amount thereof for use so as not to cause such inhibition reaction.

An amount of the compound expressed by the general formula 1 for use is appropriately determined depending on the base resin or other components for use, and amounts thereof, but it is preferably 12.5 parts by mass or more relative to 100 parts by mass of the base resin. When the amount thereof is less than 12.5 parts by mass, the formed first resist pattern may be dissolved when the second resist is applied thereto.

Surfactant

The surfactant is added for improving a coating ability of the coating material, improving compatibility of the coating material and a resist pattern, improving in-plane uniformity in the covering effect at an interface between the coating material and the resist pattern, giving defoaming properties, and the like.

The surfactant is appropriately selected depending on the intended purpose without any restriction. Examples thereof include a nonionic surfactant, a cationic surfactant, an anionic surfactant, and an amphoteric surfactant. Specific examples thereof include a polyoxyethylene-polyoxypropylene condensate surfactant, a polyoxyalkylene alkyl ether surfactant, a polyoxyethylenealkyl ether surfactant, a polyoxyethylene surfactant, a sorbitan fatty acid ester surfactant, a glycerin fatty acid ester surfactant, a primary alcohol ethoxylate surfactant, a phenol surfactant, a nonylphenol ethoxylate surfactant, an octylphenol ethoxylate surfactant, a lauryl alcohol ethoxylate surfactant, an oleyl alcohol ethoxylate surfactant, a fatty acid ester surfactant, an amide surfactant, a natural alcohol surfactant, an ethylene diamine surfactant, a secondary alcohol ethoxylate surfactant, a cationic alkyl compound surfactant, a quaternary cationic amide surfactant, a quaternary cationic ester surfactant, an amide oxide surfactant, a betaine surfactant, a silicone surfactant, and the like.

These may be used independently or in combination. Among them, the nonionic surfactant is preferable because it does not contain a metal ion such as a sodium salt, and a potassium salt.

Preferable examples of the nonionic surfactant include a surfactant containing alkoxylate, a surfactant containing fatty acid ester, a surfactant containing amide, a surfactant containing alcohol, a surfactant containing ethylene diamine, and a surfactant containing silicone. Specific examples thereof preferably include a polyoxyethylene-polyoxypropylene condensate, a polyoxyalkylene alkyl ether compound, a polyoxyethylenealkyl ether compound, a polyoxyethylene derivative, a sorbitan fatty acid ester compound, a glycerin fatty acid ester compound, a primary alcohol ethoxylate compound, and a phenol ethoxylate compound.

Moreover, other ionic surfactants may be used, provided that they are non-metal surfactants, and it is considered that the same basic effect be attained by replacing the aforementioned surfactant with these surfactant not mentioned.

An amount of the surfactant contained in the coating layer is appropriately selected depending on the resin, the compound expressed by the general formula 1, and the like for use, and amounts thereof. For example, the amount of the surfactant is preferably 0.005 parts by mass or more, more preferably 0.05 parts by mass to 2 parts by mass as use of the surfactant in such amount improves the reaction rate and in-plane uniformity, and more preferably 0.08 parts by mass to 0.25 parts by mass, relative to 100 parts by mass of the coating material.

When the amount thereof is less than 0.005 parts by mass, although the coating ability improves, the reacting weight to the resist pattern does not largely change to the case without the surfactant.

Organic Solvent

The organic solvent is appropriately selected depending on the intended purpose without any restriction, provided that it dissolves the base resin and the compound expressed by the general formula 1, but it does not dissolve the first resist pattern. Preferable examples of such organic solvents includes a C4 or larger alcohol solvent, and a C2 or larger glycol solvent. Examples of the C4 or larger alcohol solvent include isobutanol, n-butanol, and 4-methyl-2-pentanol. Examples of the C2 or larger glycol solvent include ethylene glycol, and propylene glycol. Moreover, the organic solvent having a boiling point of about 80° C. to about 200° C. is preferable because it prevent rapid drying during the coating of the coating material, and is suitably used for coating.

Other Components

The other components are appropriately selected depending on the purpose without any restriction, provided that these do not adversely affect the obtainable effect of the invention. Examples thereof include various additives known in the art, such as a phase transfer catalyst, an aromatic compound, a resin containing an aromatic compound at part of the molecular structure thereof, a thermal acid generator, a quencher (e.g. an amine quencher, and an amide quencher).

An amount of other components contained in the coating material is appropriately determined depending on the base resin, the compound expressed by the general, formula 1, the surfactant, and the like for use, or amounts thereof.

Second Coating Material

The second coating material contains at least a resin component, and a compound expressed by the following general formula 2 or 3, and may further contain appropriately selected surfactants, solvents, other components.

The resin component is a resin that can be a base material of the coating material, and may be referred to as "a base resin" hereinafter.

Base Resin

The base resin is appropriately selected depending on the intended purpose without any restriction, and examples thereof include a water-soluble resin such as polyvinyl alcohol, polyvinyl acetal, polyvinyl acetate, polyvinyl pyrrolidone, cellulose, and tannin, and a mixture thereof.

Compound Expressed by General Formula 2 or 3

The compound expressed by the general formula 2 or 3 is appropriately selected without any restriction, provided that it has an aromatic hydrocarbon compound at part of the structure thereof and the molecular structure thereof is expressed by the general formula 2 or 3. As the compound has the aromatic hydrocarbon compound, it can absorb an exposure light (e.g., ArF laser light) irradiated to a second resist film formed of a second resist composition, which will be described later. therefore, this is advantageous.

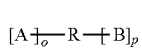
General Formula 2

In the general formula 2, R is an aromatic hydrocarbon compound; A is a monovalent organic group having a carboxyl group; and B is a hydroxyl group, an alkyl group, an alkoxy group, or an alkoxycarhonyl group.

In the general formula 2, moreover, o is an integer of 1 or larger, preferably 1, as a reaction is easily controlled by controlling occurrences of a crosslinking reaction, and in the case where o is 2 or larger, a plurality of As may be the same or different from each other.

Furthermore, p is an integer of 0 to 3, more preferably 0 to 2 for giving desirable water solubility, and in the case where p is 2 or 3, two or three Bs may be the same or different from each other.

In the general formula 2, R is appropriately selected depending on the intended purpose without any restriction, provided that it is an aromatic hydrocarbon compound.

The aromatic hydrocarbon compound is appropriately selected depending on the intended purpose without any restriction, and is preferably a compound containing an aromatic ring. Specific examples of the aromatic ring include a benzene ring, and a naphthalene ring.

In the general formula 2, A is appropriately selected depending on the intended purpose without any restriction, provided that it is a monovalent organic group containing a carboxyl group. A is preferably selected from those containing two or more groups, in combination, selected from the group consisting of a hydroxyl group, an alkyl group, an alkoxy group, a carbonyl group, and an alkoxycarbonyl group, in view of water solubility. Among them, A is preferably an organic group containing a hydroxyl group as well as the carboxyl group.

Examples of the alkyl group include a C1-C6 straight or blanched alkyl group such as a methyl group, an ethyl group, a n-propyl group, an isopropyl group, a n-butyl group, an isobutyl group.

Examples of the alkoxy group include a C1-C6 straight or blanched alkoxy group such as a methoxy group, an ethoxy group, an isopropoxy group, a butoxy group, and a hexyloxy group.

Examples of the alkoxycarbonyl group include a C1-C6 straight or blanched alkoxycarbonyl group such as a methoxycarbonyl group, an ethoxycarbonyl group, a n-propoxycarbonyl group, an isopropoxycarbonyl group, a n-butoxycarbonyl group, an isobutyloxycarbonyl group, and a tert-butyloxycarbonyl group.

"B" in the general formula 2 is at least one selected from the group consisting of a hydroxy group, an alkoxyl group, and an alkoxycarbonyl group. Among them, the hydroxy group is preferable as it provides a desirable water solubility to the resulting coating material.

Examples of the alkyl group include a C1-C6 straight or blanched alkyl group such as a methyl group, an ethyl group, a n-propyl group, an isopropyl group, a n-butyl group, an isobutyl group.

Examples of the alkoxy group include a C1-C6 straight or blanched alkoxy group such as a methoxy group, an ethoxy group, an isopropoxy group, a butoxy group, and a hexyloxy group.

Examples of the alkoxycarbonyl group include a C1-C6 straight or blanched alkoxycarbonyl group such as a methoxycarbonyl group, an ethoxycarbonyl group, a n-propoxycarbonyl group, an isopropoxycarbonyl group, a n-butoxycarbonyl group, an isobutyloxycarbonyl group, and a tert-butyloxycarbonyl group.

Specific examples of the compound expressed by the general formula 2 include mandelic acid, phenyllactate, hydroxyphenylpyruvic acid, hydroxyphenylpropionic acid, hydroxydimethylphenylpropionic acid, phenyl glutamic acid, phenylenedipropionic acid, and methylcyclohexacarboxylic acid. These may be used independently or in combination.

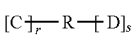
General Formula 3

In the general formula 3, R is an aromatic hydrocarbon compound; C is a functional group expressed by the following structural formula 1; and D is a hydroxyl group, an alkoxy group, an alkoxycarbonyl group, or an alkyl group.

In the general formula 3, moreover, r is an integer of 1 or larger, and in the case where r is 2 or larger, a plurality of Cs may be the same or different from each other; and s is an integer of 0 to 3, and in the case where s is 2 or 3, two or three Ds may be the same or different from each other.

In the general formula 3, R is appropriately selected depending on the intended purpose without any restriction, provided that it is an aromatic hydrocarbon compound.

The aromatic hydrocarbon compound is appropriately selected depending on the intended purpose without any restriction, and is preferably a compound containing an aromatic ring. Specific examples of the aromatic ring include a benzene ring, and a naphthalene ring.

"C" in the general formula 3 is appropriately selected depending on the intended purpose without any restriction, provided that it is a functional group expressed by the structural formula 1.

Structural Formula 1

In the structural formula 1, $R^1$ and $R^2$, which may be the same or different, are each independently a hydrogen atom or a substituent; and Z is a hydroxyl group or an alkoxy group.

Examples of the alkoxy group include a C1-C6 straight or blanched alkoxy group such as a methoxy group, an ethoxy group, an isopropoxy group, a butoxy group, and a hexyloxy group.

In the structural formula 1, $R^1$ and $R^2$ are both preferably hydrogen atoms. When $R^1$ and $R^2$ are both preferably hydrogen atoms, it is preferable in view of water solubility.

In the case where $R^1$ and $R^2$ are the aforementioned substituents in the structural formula 1, the substituents are each appropriately selected depending on the intended purpose without any restriction, and examples thereof include a ketone (alkylcarbonyl) group, an alkoxycarbonyl group, and an alkyl group.

In the general formula 3, D is a hydroxyl group, an alkoxy group, an alkoxycarbonyl group, and an alkyl group. Among them, the hydroxyl group is preferably for giving the desirable water solubility.

Examples of the alkoxy group include a C1-C6 straight or blanched alkoxy group such as a methoxy group, an ethoxy group, an isopropoxy group, a butoxy group, and a hexyloxy group.

Examples of the alkoxycarbonyl group include a C1-C6 straight or blanched alkoxycarbonyl group such as a methoxycarbonyl group, an ethoxycarbonyl group, a n-propoxycarbonyl group, an isopropoxycarbonyl group, a n-butoxycarbonyl group, an isobutyloxycarbonyl group, and a tert-butyloxycarbonyl group.

Examples of the alkyl group include a C1-C6 straight or blanched alkyl group such as a methyl group, an ethyl group, a n-propyl group, an isopropyl group, a n-butyl group, an isobutyl group.

Specific examples of the compound expressed by the general formula 3 include benzyl alcohol, 2-hydroxybenzyl alcohol(salicyl alcohol), 4-hydroxybenzyl alcohol, 2,4-dihydroxybenzyl alcohol, 1,4-benzene dimethanol, 1,3-benzenedimethanol, 1-phenyl-1,2-ethanediol, and 4-methoxymethylphenol. These may be used independently or in combination.

The benzylamine derivative, which has the similar structure to the benzyl alcohol structure, does not have a problem for forming a coating layer, but the problem known as resist poisoning, in which a protective group elimination reaction induced by an acid present in the resist is inhibited, tends to occur at the time of forming the second resist pattern. Therefore, in order to form fine patterns, it is preferred that use of such derivative be avoided.

An amount of the compound expressed by the general formula 2 or 3 for use is appropriately determined depending on the base resin, and other components for use, amounts thereof, and the like, but it is preferably 0.01 parts by mass to 10 parts by mass relative to 1 part by mass of the base resin. When the amount of the compound expressed by the general formula 2 or 3 is less than 0.01 parts by mass, there is no problem in double resist coating because of the formation of the coating layer, but the amount of the aromatic compound component in the formed coating layer is small, which causes insufficient absorption of exposure light (e.g. ArF excimer laser light) applied to the second resist film formed of the second resist composition. Therefore, in this case, the coating layer cannot prevent the first resist pattern from being exposed by the exposure light (e.g. ArF excimer laser light) applied to the second resist film, by absorbing the exposure light (e.g. ArF excimer laser light). When the amount thereof is more than 10 parts by mass, the resulting coating material has poor coatability, and thus it is difficult to form a fine resist pattern using such material, though it has no problem in absorption of exposure light (e.g. ArF light).

Surfactant

The surfactant is as described earlier, and the details thereof are the same as the first coating material.

Solvent

The solvent is appropriately selected depending on the intended purpose without any restriction, and examples thereof include water. As the water, pure water (deionized water) is preferable.

Moreover, a small amount of an organic solvent may be added for the purpose of improving a coating ability of the coating material to a resist pattern, and assisting the base resin, the compound expressed by the general formula 2 or 3, other additives, and the like to be dissolved.

The organic solvent is appropriately selected depending on the intended purpose without any restriction. Examples thereof include an alcohol-based organic solvent, a chain ester-based organic solvent, a cyclic ester-based organic solvent, a ketone-based organic solvent, a chain ether-based organic solvent, and a cyclic ether-based organic solvent.

Examples of the alcohol-based organic solvent include methanol, ethanol, propyl alcohol, isopropyl alcohol, and butyl alcohol.

Examples of the chain ester-based organic solvent include ethyl lactate, and propylene glycol methyl ether acetate (PG-MEA).

Examples of the cyclic ester-based organic solvent include a lactone-based organic solvent such as γ-butyrolactone.

Examples of the ketone-based organic solvent include a ketone-based organic solvent such as acetone, cyclohexane, and heptanone.

Examples of the chain ether-based organic solvent include ethylene glycol dimethyl ether.

Examples of the cyclic ether-based organic solvent include tetrahydrofuran, and dioxane.

These organic solvents may be used independently or in combination. Among them, those having a boiling point of about 80° C. to about 200° C. are preferable because it can realize fine formation of a coating layer.

An amount of the organic solvent is appropriately selected depending on the base resin, the compound expressed by 2 or 3, the surfactant, and other components, and amounts thereof, but is preferably 10 parts by mass or less relative to 100 parts by mass of water that is a main ingredient of the solvent. When the amount of the organic solvent is more than 10 parts by mass relative to 100 parts by mass of water, the organic solvent may dissolve the first resist pattern depending on a type of the organic solvent for use.

Other Components

Other components are appropriately selected depending on the intended purpose without any restriction, provided that they do not adversely affect the obtainable effect of the invention. Examples thereof include: various additives known in the art, such as a phase transfer catalyst, an aromatic compound, a resin containing an aromatic compound at part of the molecular structure thereof, a thermal acid generator, and a quencher (e.g. a amine quencher and an amide quencher).

A total amount of the other components is appropriately selected depending on the base resin, compound expressed by the general formula 2 or 3, the surfactant for use, and amounts thereof, without any restriction.

Coating Layer

The coating layer formed using the coating material. For example, the coating layer is formed by applying the coating material so as to over a surface of the first resist pattern.

The method for coating the coating material is appropriately selected from the conventional coating methods without any restriction, and preferable examples thereof include spin coating. In the case of the spin coating, as its conditions, for example, the rotating speed is about 100 rpm to rpm 10,000 rpm, preferably 800 rpm to 5,000 rpm, and the duration is for about 1 second to about 10 minutes, preferably 1 second to 90 seconds.

A coated thickness during the coating is generally about 10 nm to about 1,000 nm, more preferably 100 nm to 500 nm.

In the course of the coating of the coating material, the surfactant may be applied in advance to the coating material, without adding to the coating material.

It is preferred that the coated coating material be heated (pre-baking: heating and drying) during or after coating. By performing the pre-baking, the mixing (penetration) between the coating material and the material of the first resist pattern is sufficiently carried out at an interface between the first resist pattern and the coating material.

The conditions, method, and the like of the pre-baking (heating and drying) are appropriately selected depending on the intended purpose without any restriction, provided that the first resist pattern is not softened by the pre-baking. For example, the pre-baking may be performed once, or twice or more. In the case where the pre-baking is performed twice or more, the temperature for pre-baking at each time may be constant, or different. In the case where the temperature is constant, the temperature is preferably about 40° C. to about 150° C., more preferably 70° C. to 120° C. Moreover, the duration of the pre-baking is preferably about 10 seconds to about 5 minutes, more preferably 40 seconds to 100 seconds.

If necessary, a reaction baking is performed after the pre-baking (heating and drying) to accelerate the reaction of the applied coating material. The reaction baking is preferable, as it efficiently progresses the reaction in the area where the material of the resist pattern and the coating material are mixed (penetrated) at an interface between the resist pattern and the coating material.

The conditions, method, and the like of the reaction baking are appropriately selected depending on the intended purpose without any restriction, For the reaction baking, the temperature condition is generally higher than that of the prebaking (heating and drying). As the conditions of the reaction baking, for example, the temperature is about 70° C. to about 150° C., preferably 90° C. to 130° C., and the duration is about 10 seconds to about 5 minutes, more preferably 40 seconds to 100 seconds.

Moreover, it is preferred that developing (removing unreacted portions) be performed on the applied coating material after the reaction baking. This is because the first resist pattern on which the coating layer has been formed can be developed (obtained) by dissolving and removing portions where the coating material and the material of the first resist pattern are not interacted (mixed) and reacted, and/or portions (highly alkali soluble or water soluble portions) where the interaction (mixing) thereof is weak within the entire coating material applied.

The developing solution used for developing is appropriately selected depending on the intended purpose without any restriction, and preferable examples include an alkali developing solution, and water (pure water). These may be used independently or in combination. For the developing process using these developing solutions, it is not necessary to install a new chemical solution line, and the same resist developing cup used in other developing processes can be used, which contributes to reduce the cost of the installation for use.

Preferable examples of the alkali developing solution include a 2.38% by mass tetramethylammonium hydroxide (TMAH) solution.

Coating Layer of First Coating Material

The coating layer of the first coating material is formed, for example, by applying, over the first resist pattern, the coating material which has been prepared, for example, dissolving a base resin at least one selected from a phenol resin and polyvinyl pyrrolidone, and a benzyl alcohol compound a reaction of which can be easily controlled (i.e. not causing a crosslinking reaction). The coating layer formed of the first coating material can prevent the interaction (mixing) between the first resist pattern and the second resist composition by the double resist coating, as well as preventing the first resist pattern from being exposed again to the exposure light (e.g. ArF excimer laser light) by absorbing the exposure light (e.g. ArF excimer laser light) applied to the second resist film of the second resist composition.

Specific example of the coating layer formed of the first coating material will be explained below.

After forming a first resist pattern (for example, of 32 nm-line (L)/96 nm-space (S)) using an ArF resist, a coating material prepared by mixing a base resin which is polyparahydroxystyrene, and additives, which are 2-hydroxybenzyl alcohol and isobutanol, is applied, the first resist pattern to which the coating material has been applied is then baked to thereby form a coating layer on the first resist pattern. During the baking, mixing occurs at an interface between the first resist pattern and the coating material, and in the portions where the mixing occurred the 2-hydroxybenzyl alcohol reacts with the adjacent polyparahydroxystyrene. Thereafter, by developing with a weak alkali water solution, the portions which have had the weak reaction and are highly alkali soluble are dissolved, to thereby form a first resist pattern on which the coating layer has been formed. These portions of the first resist pattern, to which the coating material has been penetrated and reacted, contains aromatic rings from the polyparahydroxystyrene and the 2-hydroxybenzyl alcohol, and thus the resulting first resist pattern has low transmissiveness to ArF excimer laser light, and realizes a double coating of a resist as the coating material and a second resist composition will not be mixed.

Coating Layer of Second Coating Material

The coating layer of the second coating material is formed by applying, onto the first resist pattern, a coating material in which a water-soluble resin such as polyvinyl alcohol serving as a base resin, a benzyl alcohol compound a reaction of which is easily controlled (which would not induce a crosslinking reaction), and a water-soluble compound having an aromatic hydrocarbon compound such as phenyllactate containing carboxylic acid are dissolved in a main solvent, which is water. The coating layer formed of the second coating material can prevent the interaction (mixing) between the first resist pattern and the second resist composition by the double resist coating, as well as preventing the first resist pattern from being exposed again to the exposure light (e.g. ArF excimer laser light) by absorbing the exposure light (e.g. ArF excimer laser light) applied to the second resist film of the second resist composition.

Specific example of the coating layer formed of the second coating material will be explained below.

After forming a first resist pattern (for example, of 32 nm-line (L)/96 nm-space (S)) using an ArF resist, a coating material prepared by dissolving a base resin which is polyvinyl alcohol, and an additive, which is hydroxybenzyl alcohol in water, is applied, the first resist pattern to which the coating material has been applied is then baked to thereby form a coating layer on the first resist pattern. During the baking, mixing occurs at an interface between the first resist pattern and the coating material, and in the portions where the mixing occurred the hydroxybenzyl alcohol reacts with the adjacent polyvinyl alcohol. Thereafter, by developing with water, the portions which have had the weak reaction and are highly water soluble are dissolved, to thereby form a first resist pattern on which the coating layer has been formed. These portions of the first resist pattern, to which the coating material has been penetrated and reacted, contains aromatic rings from the hydroxybenzyl alcohol, and thus the resulting first resist pattern has low transmissiveness to ArF excimer laser light, and realizes a double coating of a resist as the coating material and a second resist composition will not be mixed.

Second Resist Pattern Forming Step

The second resist pattern forming step is applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern, as well as forming a second resist pattern in an area of the processing surface where the first resist pattern has not been formed.

The second resist pattern can be formed by coating the second resist composition in a method known in the art to form a second resist film, selectively exposing the second resist film to exposure light, and developing the exposed film.

The second resist composition is appropriately selected from resist materials known in the art depending on the intended purpose without any restriction, and is suitably selected from those listed as the examples of the first resist composition. Moreover, the second resist composition may be the same or different from the first resist composition.

A forming method, size, thickness, and the like of the second resist pattern are appropriately selected depending on the intended purpose without any restriction. The thickness of the second resist pattern is appropriately determined depending on a processing surface that is a target for processing, etching conditions, and the like, but it is generally about 100 nm to about 700 nm.

In the second resist pattern forming step, for example, a second resist film is formed on the first resist pattern on which the coating layer has been formed, the alignment of the pattern is adjusted by providing a mask (32 nm line (L)/96 nm space (S)) sifted by 64 nm from the first resist pattern, and exposure, post-bake exposure, and developing are performed on thereby form a second resist pattern in the area where the first resist pattern has not been formed (the area negative to the first resist pattern). In this manner, a fine pattern of 32 nm-line (L) and 32 nm-space (S), which cannot be formed in accordance with techniques in the art, can be formed.

Other Steps

Examples of other steps include a patterning step, a surfactant coating step, and the like.

The patterning step is etching the processing surface using the first and second resist patterns as a mask (as a mask pattern) to thereby pattern the processing surface.

A method of etching is appropriately selected from methods known in the art depending on the intended purpose without any restriction. Examples thereof include dry etching. Conditions for the etching are appropriately selected depending on the intended purpose without any restriction.

The surfactant coating step is, in advance to the coating layer forming step, applying a surfactant to a surface of the first resist pattern.

The surfactant is appropriately selected depending on the intended purpose without any restriction, and preferable examples thereof are those described earlier, such as a polyoxyethylene-polyoxypropylene condensate surfactant, a polyoxyalkylene alkyl ether compound, a polyoxyethylene alkyl ether compound, a polyoxyethylene derivative, a sorbitan fatty acid ester compound, a glycerin fatty acid ester compound, a primary alcohol ethoxylate compound, a phenol ethoxylate compound, a nonylphenol ethoxylate compound, an octylphenol ethoxylate compound, a lauryl alcohol ethoxylate compound, an oleyl alcohol ethoxylate compound, a fatty acid ester surfactant, an amide surfactant, a natural alcohol surfactant, an ethylene amine surfactant, a secondary alcohol ethoxylate surfactant, a cationic alkyl compound, a quaternary cationic amide surfactant, a quaternary cationic ester surfactant, an amine oxide surfactant, a betaine surfactant, a silicone surfactant, and the like.

Hereinafter, the method for manufacturing a semiconductor device will be explained with reference to drawings.

Figure 2A:
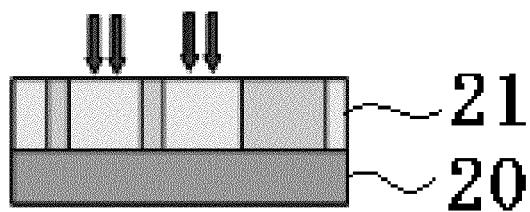
FIG. 2A is a schematic diagram for explaining one example of a first resist pattern forming step of the method for manufacturing a semiconductor device, and illustrates the state where a first resist film is subjected to exposure.
Figure 2B:
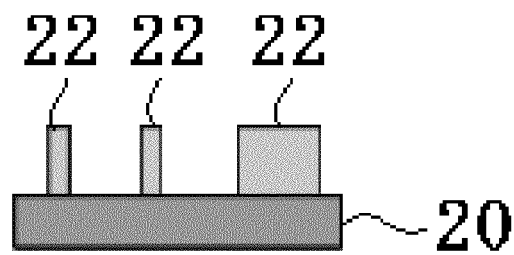
FIG. 2B is a schematic diagram for explaining one example of a first resist pattern forming step of the method for manufacturing a semiconductor device, and illustrates the state where a first resist pattern is formed.
Figure 2C:
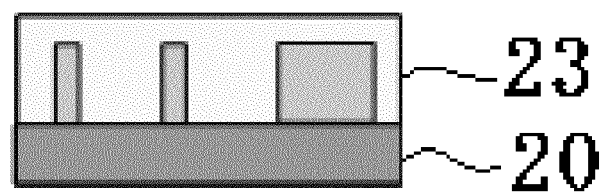
FIG. 2C is a schematic diagram for explaining one example of a coating layer forming step of the method for manufacturing a semiconductor device, and illustrates the state where a coating material is applied.
Figure 2D:
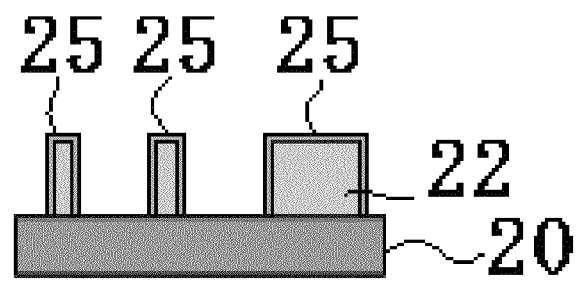
FIG. 2D is a schematic diagram for explaining one example of a coating layer forming step of the method for manufacturing a semiconductor device, and illustrates the state where a coating layer is formed.
Figure 2E:
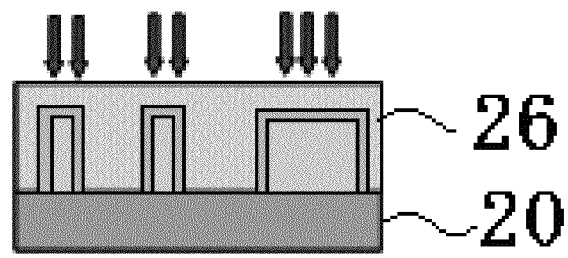
FIG. 2E is a schematic diagram for explaining one example of a second resist pattern forming step of the method for manufacturing a semiconductor device, and illustrates the state where a second resist film is subjected to exposure.

As illustrated in FIGS. 2A to 2F, exposure and developing are performed on a resist film 21 formed on a processing surface of a substrate 20 (FIG. 2A) to form a first resist pattern 22 (FIG. 2B); a coating material 23 is applied onto the first resist pattern 22 (FIG. 2C); and baking and developing are performed to form a coating layer 25 on the first resist pattern 22 (FIG. 2D).

Figure 2F:
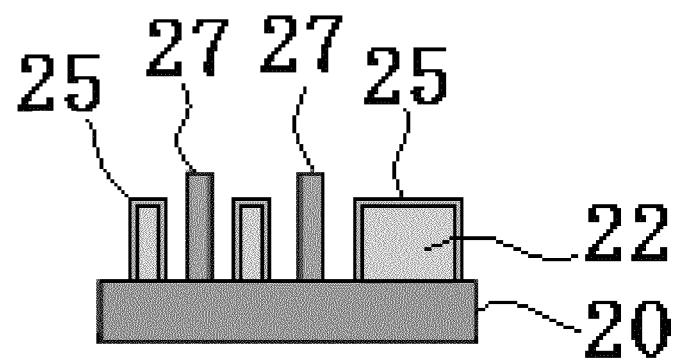
FIG. 2F is a schematic diagram for explaining one example of a second resist pattern forming step of the method for manufacturing a semiconductor device, and illustrates the state where a second resist pattern is formed.

A second resist composition is coated on the coating layer 25 to form a second resist film 26; alignment of a pattern is adjusted by using a mask sifted so as to provide a second resist pattern in an area of the processing surface (the area negative to the first resist pattern 25) of the substrate 20 where the first resist pattern 25 has not been formed; exposure, post-baking exposure (PEB), and developing are performed (FIG. 2E) to form the second resist pattern 27 on the area negative to the first resist pattern 25 (FIG. 2F). In the manner described, fine resist pattern is formed, and moreover a fine pattern, which cannot be formed in accordance with any of conventional techniques, can be formed on a processing surface.

In Examples below, a manufacturing method of a semiconductor device is explained as one of examples of the invention, but the effects of the invention can be also exhibited in the productions of the following products having fine patterns. Examples thereof include a mask pattern, a reticle pattern, a magnetic head, a liquid crystal display (LCD), a plasma display panel (PDP), functional parts such as a surface acoustic wave (SAW) filter, optical parts used for connections of optical wiring, and precision parts such as a microactuator.

According to the method for manufacturing a semiconductor device, various semiconductor devices such as a flash memory, a logic device, DRAM, FRAM, and the like are efficiently manufactured.

(Material for Forming Coating Layer)

A material for forming a coating layer of the first embodiment is used in the aforementioned method for manufacturing a semiconductor device, and contains a base resin, which is a phenol resin, or polyvinyl pyrrolidone, or both thereof, and a compound expressed by the following general formula 1.

General Formula 1

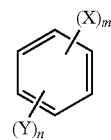

In the general formula 1, X is a functional group expressed by the following structural formula 1; Y is a hydroxyl group, an alkoxyl group, an alkoxycarbonyl group, or an alkyl group; m is an integer of 1 or larger, and in the case where m is 2 or larger, a plurality of Xs may be the same or different from each other; and n is an integer of 0 to 3, and in the case where n is 2 or 3, two or three Ys may be the same or different from each other.

Structural Formula 1

In the structural formula 1, $R^1$ and $R^2$, which may be the same or different, are each independently a hydrogen atom or a substituent; and Z is a hydroxyl group or an alkoxy group.

Note that, the details of the base resin, and the compound expressed by the general formula 1 are as described earlier.

A material for forming a coating layer of the second embodiment is used in the aforementioned method for manufacturing a semiconductor device, and contains a base resin, which is a water-soluble resin, and a compound expressed by the general formula 2 or 3.

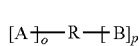

General Formula 2

In the general formula 2, R is an aromatic hydrocarbon compound; A is a monovalent organic group having a carboxyl group; B is a hydroxyl group, an alkyl group, an alkoxy group, or an alkoxycarbonyl group; o is an integer of 1 or larger, and in the case where o is 2 or larger, a plurality of As may be the same or different from each other; and p is an integer of 0 to 3, and in the case where p is 2 or 3, two or three Bs may be the same or different from each other.

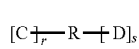

General Formula 3

In the general formula 3, R is an aromatic hydrocarbon compound; C is a functional group expressed by the following structural formula 1; D is a hydroxyl group, an alkoxy group, an alkoxycarbonyl group, or an alkyl group; r is an integer of 1 or larger, and in the case where r is 2 or larger, a plurality of Cs may be the same or different from each other; and s is an integer of 0 to 3, and in the case where s is 2 or 3, two or three Ds may be the same or different from each other.

Structural Formula 1

In the structural formula 1, $R^1$ and $R^2$, which may be the same or different, are each independently a hydrogen atom or a substituent; and Z is a hydroxyl group or an alkoxy group.

Note that, the details of the base resin, and the general formulae 2 and 3 are as described earlier.

EXAMPLES

Examples of the present invention will be explained hereinafter, but these examples shall not be construed as limiting the scope of the present invention in any way.

Example 1

Preparation of Coating Material 1

Coating materials A to L each having a respective formulation presented in Table 1, which were nonaqueous and did not contain a crosslinking agent, were prepared.

In Table 1, "A" to "L" respectively correspond to coating materials A to L. Within the coating materials A to L, the coating material A is Comparative Example, and the coating materials B to L are Examples (embodiments of the invention). The unit of the values within the brackets is "parts by mass" in Table 1.

In the columns of "Compound expressed by general formula 1" of the coating materials B to L, benzyl alcohol derivative is a compound expressed by the following general formula 1, and "2-hydroxybenzyl alcohol", "4-hydroxybenzyl alcohol" and "2,4-dihydroxybenzyl alcohol" are the ones manufactured by Kanto Chemical Co., Inc.

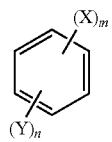

General Formula 1

In the general formula 1, X is a functional group expressed by the following structural formula 1; Y is a hydroxyl group, an alkoxyl group, an alkoxycarbonyl group, or an alkyl group; m is an integer of 1 or larger, and in the case where m is 2 or larger, a plurality of Xs may be the same or different from each other; and n is an integer of 0 to 3, and in the case where n is 2 or 3, two or three Ys may be the same or different from each other.

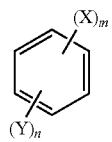

Structural Formula 1

In the structural formula 1, $R^1$ and $R^2$, which may be the same or different, are each independently a hydrogen atom or a substituent; and Z is a hydroxyl group or an alkoxy group.

Moreover, in the column of "Resin," "PHS" is a polyparahydroxystyrene resin ("MARUKA LYNCUR"; manufactured by Maruzen Petrochemical Co., Ltd.), and "PVPd" is polyvinyl pyrrolidone resin ("PVPd K=30"; manufactured by Kanto Chemical Co., Inc.). "Poly($HS_{90}$-$Pd_{10}$)" is hydroxystyrene-vinyl pyrrolidone copolymer (molecular weight: 6,800), which is synthesized by a polymerization reaction of azobisisobutyronitrile (AIBN) with a radical initiator according to the common method. "novolac resin" is the one manufactured by ZEON CORPORATION.

In the column of "Solvent," "isobutanol" is the one manufactured by Tokyo Chemical Industry Co., Ltd., "ethylene glycol" is the one manufactured by Kanto Chemical Co., Inc., "diisopentyl ether" is the one manufactured by Tokyo Chemical Industry Co., Ltd., and "3-methyl-3-pentanol" is the one manufactured by Tokyo Chemical Industry Co., Ltd.

In the column of "Surfactant," "KP-341" is a nonionic silicone surfactant (manufactured by Shin-Etsu Chemical Co., Ltd.), and "PC-6" is a nonionic surfactant (a polynuclear phenol surfactant, manufactured by ADEKA CORPORATION).

TABLE 1

| Coating material | Resin (parts by mass) | Compound expressed by General formula 1 (parts by mass) | Solvent (parts by mass) | Surfactant (parts by mass) |
|---|---|---|---|---|
| A | PHS(4) | — | isobutanol (96) | — |
| B | PHS(4) | 4-hydroxybenzyl alcohol (2) | isobutanol (96) | — |
| C | PHS(4) | 2-hydroxybenzyl alcohol (2) | ethylene glycol (40)/ isobutanol (56) | — |
| D | PHS(4) | 2-hydroxybenzyl alcohol (2) | isobutanol (96) | — |
| E | PHS(4) | 2-hydroxybenzyl alcohol (2) | isobutanol (96) | KP-341 (0.005) |
| F | PVPd(4) | 4-hydroxybenzyl alcohol (2) | isobutanol (80)/ diisopentyl ether (16) | — |
| G | PVPd (4) | 2-hydroxybenzyl alcohol (2) | isobutanol(96) | — |
| H | PVPd(4) | 2-hydroxybenzyl alcohol (2) | 3-methyl-3-pentanol (46)/ isobutanol(50) | PC-6 (0.003) |
| I | Poly($HS_{90}$—$Pd_{10}$) (4) | 2-hydroxybenzyl alcohol (2) | isobutanol(90)/ ethylene glycol (6) | — |
| J | Novorac resin (4) | 2,4-dihydroxybenzyl alcohol (2) | isobutanol(36)/ ethylene glycol (60) | — |
| K | PHS(4) | 2-hydroxybenzyl alcohol (1) | isobutanol(96) | — |
| L | PHS(4) | 2-hydroxybenzyl alcohol (3) | isobutanol(96) | — |

Example 2

Formation of Coating Layer 1

On a resist pattern (150 nm-line (L)/150 nm-space (S)) formed of any of alicyclic ArF resists a to c presented in Table 2, each of the coating materials A to L prepared in Example 1 was applied by spin coating initially at 1,000 rpm for 5 seconds, sequentially at 3,500 rpm for 40 seconds. Then, the coated resist pattern was baked at 110° C. for 60 seconds.

Next, each of the baked coating materials A to E, and I to L (i.e. the coating materials using PHS or the novolac resin as a resin) was rinsed with a 2.38% tetramethyl ammonium hydroxide (TMAH) alkali developing solution for 60 seconds, followed by rinsing with pure water for 60 seconds, to thereby remove unreacted portions where the material of the resist pattern and the coating material had not been interacted (mixed). Each of the based coating materials F to H (i.e. the coating materials using PVPd as a resin) was rinsed with pure water or 2.38% TMAH for 60 seconds, followed by rinsing with pure water for 60 seconds, to thereby remove unreacted portions where the material of the resist pattern and the coating material had not been interacted (mixed).

In the column of "Alicyclic ArF resist" of Table 2, "a" is FJ25 (manufactured by Tokyo Ohka Kogyo Co., Ltd.), "b" is GAR-8109D05 (manufactured by FUJIFILM Electronic Materials Co., Ltd.), and "c" is XP-7089D (manufactured by Rohm and Haas).

Thereafter, propylene glycol methyl ether acetate (PGMEA), which was commonly used as a solvent for a resist, was applied dropwise so as to cover the entire surface of the resist pattern on which the coating layer had been formed. Then, PGMEA was removed by spinning, followed by subjected to baking at 110° C. for 60 seconds. The baked pattern was then judged whether the resist pattern had been dissolved. In Table 2, the case where the resist pattern was dissolved was marked as C, the case where the resist pattern was not dissolved was marked as A, and the case where part of the pattern was deformed (or dissolved) was marked as B.

TABLE 2

| Coating material | Alicyclic ArF resist | Solubility of pattern |
|---|---|---|
| A | a | C |
| B | a | A |
| C | a | A |
| D | b | A |
| E | c | A |
| F | b | B |
| G | c | A |
| H | a | A |
| I | c | A |
| J | c | A |
| K | a | B |
| L | a | A |

In the manner mentioned above, it was confirmed that the coating layer which was not dissolved with the solvent of the resist was formed on the resist pattern using the coating materials B to L.

Example 3

Formation of Resist Pattern 1

On a Si wafer to which ARC29 (manufactured by Nissan Chemical Industries, Ltd.) had been coated as an underlayer antireflection film, the resist a was applied by spin coating to give a thickness of 200 nm, and then baked. Next, a first resist pattern of 130 nm-line (L)/470 nm-space (S) was formed in the resist by means of an ArF exposure device, and the coating material C prepared in Example 1 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist a was applied again by spin coating at the same conditions as before, and then baked. The applied resist a was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 1 of 150 nm-line (L)/150 nm-space (S) was formed.

Example 4

Formation of Resist Pattern 2

On a Si wafer to which ARC29 (manufactured by Nissan Chemical Industries, Ltd.) had been coated as an underlayer antireflection film, the resist b was applied by spin coating to give a thickness of 200 nm, and then baked. Next, a first resist pattern of 140 nm-line (L)/460 nm-space (S) was formed in the resist by means of an ArF exposure device, and the coating material G prepared in Example 1 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist b was applied again by spin coating at the same conditions as before, and then baked. The applied resist a was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 2 of 150 nm-line (L)/150 nm-space (S) was formed.

Example 5

Formation of Resist Pattern 3

On a Si wafer to which ARC29 (manufactured by Nissan Chemical Industries, Ltd.) had been coated as an underlayer antireflection film, the resist c was applied by spin coating to give a thickness of 200 nm, and then baked. Next, a first resist pattern of 140 nm-line (L)/460 nm-space (S) was formed in the resist by means of an ArF exposure device, and the coating material I prepared in Example 1 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist c was applied again by spin coating at the same conditions as before, and then baked. The applied resist a was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 3 of 150 nm-line (L)/150 nm-space (S) was formed.

Example 6

Formation of Resist Pattern 4

On a Si wafer to which ARC29 (manufactured by Nissan Chemical Industries, Ltd.) had been coated as an underlayer antireflection film, the resist c was applied by spin coating to give a thickness of 200 nm, and then baked. Next, a first resist pattern of 145 nm-line (L)/455 nm-space (S) was formed in the resist by means of an ArF exposure device, and the coating material K prepared in Example 1 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist a was applied again by spin coating at the same conditions as before, and then baked. The applied resist a was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 4 of 150 nm-line (L)/150 nm-space (S) was formed.

Comparative Example 1

Formation of Comparative Resist Pattern 1

On a Si wafer to which ARC29 (manufactured by Nissan Chemical Industries, Ltd.) had been coated as an underlayer antireflection film, the resist a was applied by spin coating to give a thickness of 200 nm, and then baked. Next, a first resist pattern of 150 nm-line (L)/450 nm-space (S) was formed in the resist by means of an ArF exposure device, and the coating material A prepared in Example 1 was uniformly applied on the line portions (i.e. portions where the resist remained) of the first resist pattern to thereby form a coating layer.

Figure 3:
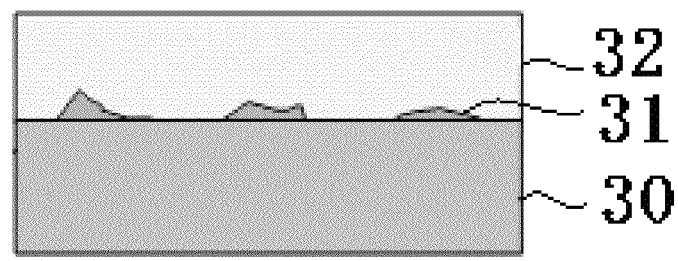
FIG. 3 is a schematic diagram for explaining resist pattern formed in Comparative Examples 1 and 2.

Next, the resist a was applied again by spin coating at the same conditions as before, and then baked. As a result, the first resist pattern was dissolved and deformed (because of the missing parts by dissolution) as illustrated in FIG. 3, which confirmed that a double resist coating could not be realized here. FIG. 3 illustrates the state that part of the first resist pattern 31 formed on the Si substrate 30 was disappeared as a result of the formation of the second resist film 32.

Example 7

Preparation of Coating Material 2

Coating materials each having a respective formulation presented in Table 3, which were nonaqueous and did not contain a crosslinking agent, were prepared.

In Table 3, "I" to "X" respectively correspond to coating materials I to X. Within the coating materials I to X, the coating material I is Comparative Example, and the coating materials II to X are Examples (embodiments of the invention). The unit of the values within the brackets is "parts by mass" in Table 3.

In the columns of "Compound expressed by general formula 2 or 3" of the coating materials II to X, 2-hydroxybenzyl alcohol, 4-hydroxybenzyl alcohol, and phenyllactate are compounds expressed by the general formula 2 or 3, "2-hydroxybenzyl alcohol" and "4-hydroxybenzyl alcohol" are the ones manufactured by Kanto Chemical Co., Inc., "phenyllactate" is the one manufactured by Acros Organics.

General Formula 2

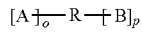

In the general formula 2, R is an aromatic hydrocarbon compound; A is a monovalent organic group having a carboxyl group; B is a hydroxyl group, an alkyl group, an alkoxy group, or an alkoxycarbonyl group; o is an integer of 1 or larger, and in the case where o is 2 or larger, a plurality of As may be the same or different from each other; and p is an integer of 0 to 3, and in the case where p is 2 or 3, two or three Bs may be the same or different from each other.

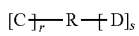   General Formula 3

In the general formula 3, R is an aromatic hydrocarbon compound; C is a functional group expressed by the following structural formula 1; D is a hydroxyl group, an alkoxy group, an alkoxycarbonyl group, or an alkyl group; r is an integer of 1 or larger, and in the case where r is 2 or larger, a plurality of Cs may be the same or different from each other; and s is an integer of 0 to 3, and in the case where s is 2 or 3, two or three Ds may be the same or different from each other.

   Structural Formula 1

In the structural formula 1, $R^1$ and $R^2$, which may be the same or different, are each independently a hydrogen atom or a substituent; and Z is a hydroxyl group or an alkoxy group.

In the column of "Resin," "PVA" is a polyvinyl alcohol resin ("PVA-205C", manufactured by Kuraray Co., Ltd.), "PVAc" is a polyvinyl acetal resin ("KW-3", manufactured by Sekisui Chemical Co., Ltd.), and "PVPd" is a polyvinyl pyrrolidone resin ("PVPd K=30"; manufactured by Kanto Chemical Co., Inc.).

In the column of "Surfactant,", "TN-80" is a nonionic surfactant (a primary alcohol ethoxylate surfactant, manufactured by ADEKA CORPORATION), "PC-6" is a nonionic surfactant (a polynuclear phenol surfactant, manufactured by ADEKA CORPORATION).

The base of the solvent was pure water (100 parts by mass), and when an organic solvent was added, a solvent(s) for use and added amount(s) were as described in the column of "Solvent" in Table 3. In the column of "Solvent," "isopropyl alcohol" is the one manufactured by Wako Pure Chemical Industries, Ltd.

TABLE 3

| Coating material | Resin (parts by mass) | Water-soluble compound expressed by General formula 2 or 3 (parts by mass) | Surfactant (parts by mass) | Solvent (parts by mass) |
|---|---|---|---|---|
| I | PVA(4) | — | — | pure water (100) |
| II | PVA(4) | 2-hydroxybenzyl alcohol (0.02) | TN-80 (0.06) | pure water (100) |
| III | PVA(4) | 2-hydroxybenzyl alcohol (2) | TN-80 (0.06) | pure water (100) |
| IV | PVA(4) | 4-hydroxybenzyl alcohol (2) | TN-80 (0.06) | pure water (100) |
| V | PVA(4) | 2-hydroxybenzyl alcohol (4) | TN-80 (0.06) | pure water (100) |
| VI | PVA(4) | 2-hydroxybenzyl alcohol (8) | TN-80 (0.06) | pure water (100) |
| VII | PVA(4) | phenyllactate (4) | TN-80 (0.06) | pure water (100) |
| VIII | PVAc(4) | 2-hydroxybenzyl alcohol (4) | PC-6 (0.02) | pure water (100) + isopropyl alcohol(0.5) |

TABLE 3-continued

| Coating material | Resin (parts by mass) | Water-soluble compound expressed by General formula 2 or 3 (parts by mass) | Surfactant (parts by mass) | Solvent (parts by mass) |
|---|---|---|---|---|
| IX | PVAc(4) | phenyllactate (4) | TN-80 (0.02) | pure water (100) + isopropyl alcohol(0.5) |
| X | PVPd(4) | 2-hydroxybenzyl alcohol (4) | TN-80 (0.02) | pure water (100) |

Example 8

Formation of Coating Layer 2

On a resist pattern (150 nm-line (L)/150 nm-space (S)) formed of an alicyclic ArF resist FJ25 (manufactured by Tokyo Ohka Kogyo Co., Ltd.), each of the coating materials I to X prepared in Example 7 was applied by spin coating initially at 850 rpm for 5 seconds, sequentially at 3,000 rpm for 20 seconds. Then, the coated resist pattern was baked at 110° C. for 60 seconds, followed by rinsing with is pure water for 60 seconds to thereby remove unreacted portions where the material of the resist pattern and the coating material had not been interacted (mixed).

Thereafter, propylene glycol methyl ether acetate (PG-MEA), which was commonly used as a solvent for a resist, was applied dropwise and subjected to spin-off coating so as to cover the entire surface of the resist pattern on which the coating layer had been formed. Then, the resist pattern was subjected to baking at 110° C. for 60 seconds. The baked pattern was then judged whether the resist pattern had been dissolved. In Table 4, the case where the resist pattern was dissolved was marked as C, the case where the resist pattern was not dissolved was marked as A, and the case where part of the pattern was deformed (or dissolved) was marked as B.

TABLE 4

| Coating material | Solubility of pattern |
|---|---|
| I | C |
| II | B |
| III | A |
| IV | A |
| V | A |
| VI | A |
| VII | A |
| VIII | A |
| IX | A |
| X | A |

In the manner mentioned above, it was confirmed that the coating layer which was not dissolved with the solvent of the resist was formed on the resist pattern using the coating materials II to X.

Example 9

Formation of Resist Pattern 5

On a Si wafer to which ARC29 (manufactured by Nissan Chemical industries, Ltd.) had been coated as an underlayer antireflection film, a resist FJ25 (manufactured by Tokyo Ohka Kogyo Co., Ltd.) was applied by spin coating to give a thickness of 200 nm, and then baked. Next, a first resist pattern of 140 nm-line (L)/460 nm-space (S) was formed in the resist by means of an ArF exposure device, and the coating material V prepared in Example 7 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist FJ25 was applied again by spin coating at the same conditions as before, and then baked. The applied resist was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 5 of 150 nm-line (L)/150 nm-space (S) was formed.

Example 10

Formation of Resist Pattern 6

On a Si wafer to which ARC29 (manufactured by Nissan Chemical Industries, Ltd.) had been coated as an underlayer antireflection film, a resist FJ25 (manufactured by Tokyo Ohka Kogyo Co., Ltd.) was applied by spin coating to give a thickness of 200 nm, and then baked. Next, a first resist pattern of 130 nm-line (L)/470 nm-space (S) was formed in the resist by means of an ArF exposure device, and the coating material VII prepared in Example 7 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist FJ25 was applied again by spin coating at the same conditions as before, and then baked. The applied resist was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 6 of 150 nm-line (L)/150 nm-space (S) was formed.

Example 11

Formation of Resist Pattern 7

On a Si wafer to which ARC29 (manufactured by Nissan Chemical Industries, Ltd.) had been coated as an underlayer antireflection film, a resist FJ25 (manufactured by Tokyo Ohka Kogyo Co., Ltd.) was applied by spin coating to give a thickness of 200 nm, and then baked. Next, a first resist pattern of 140 nm-line (L)/460 nm-space (S) was formed in the resist by means of an ArF exposure device, and the coating material X prepared in Example 7 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist FJ25 was applied again by spin coating at the same conditions as before, and then baked. The applied resist was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, a resist pattern 7 of 150 nm-line (L)/150 nm-space (S) was formed.

Example 12

Formation of Resist Pattern 8

On a Si wafer to which ARC29 (manufactured by Nissan Chemical Industries, Ltd.) had been coated as an underlayer antireflection film, a resist FJ25 (manufactured by Tokyo Ohka Kogyo Co., Ltd.) was applied by spin coating to give a thickness of 200 nm, and then baked. Next, a first resist pattern of 145 nm-line (L)/455 nm-space (S) was formed in the resist by means of an ArF exposure device, and the coating material II prepared in Example 7 was uniformly applied on the line portions (i.e. portions where the resist remained) of the first resist pattern to thereby form a coating layer. Then, a width of the line portion of the first resist pattern and a width of the space portion thereof were measured by CD-SEM (HITACHI S-6100S), and were respectively 150 nm, and 450 nm.

Next, the resist FJ25 was applied again by spin coating at the same conditions as before, and then baked. The applied resist was exposed through a mask having a pattern (150 nm-line (L)/450 nm-space (S)) sifted from the formed first resist pattern by 300 nm, followed by subjected to baking and developing, to thereby form a second resist pattern of 150 nm-line (L)/450 nm-space (S). As a result, although part of the first resist pattern was suffered from slimming or disappeared, a resist pattern 8 of 150 nm-line (L)/150 nm-space (S) was formed.

Comparative Example 2

Formation of Comparative Resist Pattern 2

On a Si wafer to which ARC29 (manufactured by Nissan Chemical Industries, Ltd.) had been coated as an underlayer antireflection film, a resist FJ25 (manufactured by Tokyo Ohka Kogyo Co., Ltd.) was applied by spin coating to give a thickness of 200 nm, and then baked. Next, a first resist pattern of 150 nm-line (L)/450 nm-space (S) was formed in the resist by means of an ArF exposure device, and the coating material I prepared in Example 7 was uniformly applied on the line portions (i.e. portions where the resist remained) of the first resist pattern to thereby form a coating layer.

Next, the resist FJ25 a was applied again by spin coating at the same conditions as before, and then baked. As a result, the first resist pattern was dissolved and deformed (because of the missing parts by dissolution) as illustrated in FIG. 3, which confirmed that a double resist coating could not be realized here.

Example 13

Production of Semiconductor Device

Figure 4A:
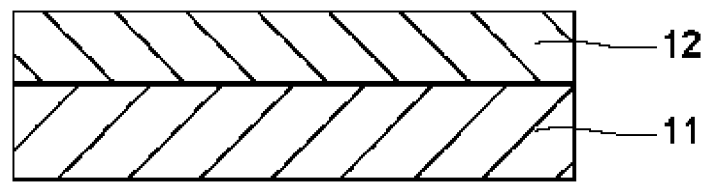
FIG. 4A is a schematic diagram for explaining one example of the method for manufacturing a semiconductor device, and illustrates a state where an interlayer insulating film is formed on a silicon substrate.
Figure 4B:
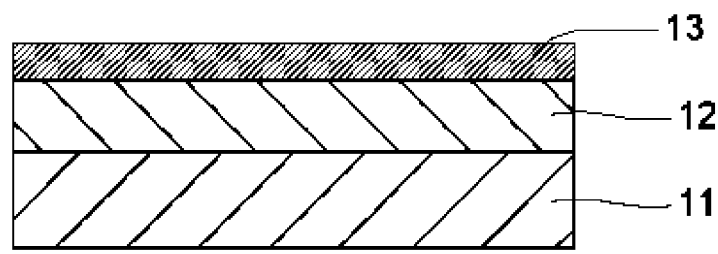
FIG. 4B is a schematic diagram for explaining one example of the method for manufacturing a semiconductor device, and illustrates a state where a titanium film is formed on the interlayer insulating film illustrated in FIG. 4A.
Figure 4C:
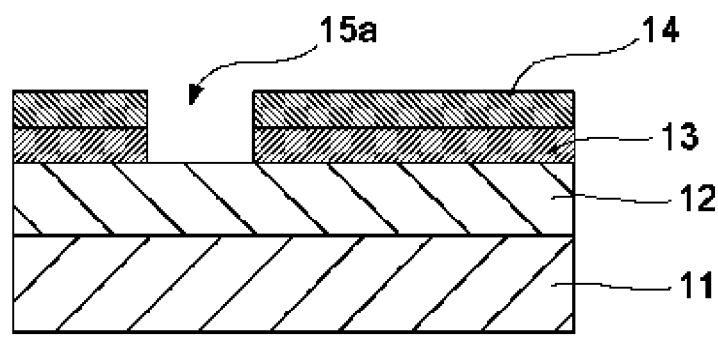
FIG. 4C is a schematic diagram for explaining one example of the method for manufacturing a semiconductor device, and illustrates a state where a resist film is formed on the titanium film, and a hole pattern is formed in the titanium film.
Figure 4D:
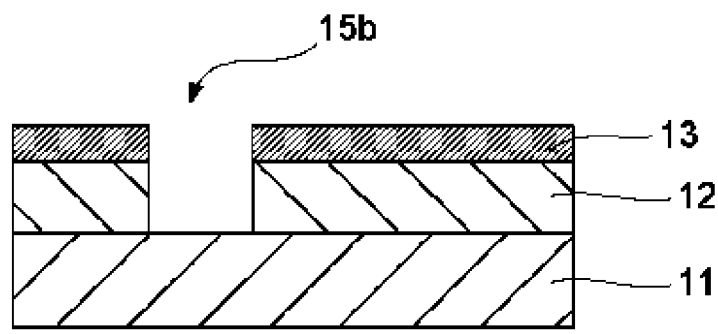
FIG. 4D is a schematic diagram for explaining one example of the method for manufacturing a semiconductor device, and illustrates a state where the hole pattern is also formed in the interlayer insulating film.

An interlayer insulating film 12 was formed on a silicon substrate 11 as illustrated in FIG. 4A, and then a titanium film 13 was formed on the interlayer insulating film 12 by sputtering as illustrated in FIG. 4B. Then, as illustrated in FIG. 4C, a resist pattern 14 was formed by the double patterning method of the embodiment, and using the formed pattern as a mask, the titanium film 13 was subjected to patterning by reactive ion etching to thereby form an opening 15a. Sequentially, as well as removing the resist pattern 14 by reactive ion etching, an opening 15b was formed in the interlayer insulating film 12 using the titanium film 13 as a mask, as illustrated in FIG. 4D.

Figure 4E:
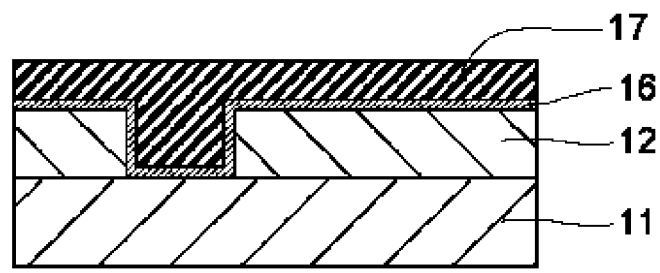
FIG. 4E is a schematic diagram for explaining one example of the method for manufacturing a semiconductor device, and illustrates a state where a Cu film is formed on the interlayer insulating film in which the hole pattern is formed.
Figure 4F:
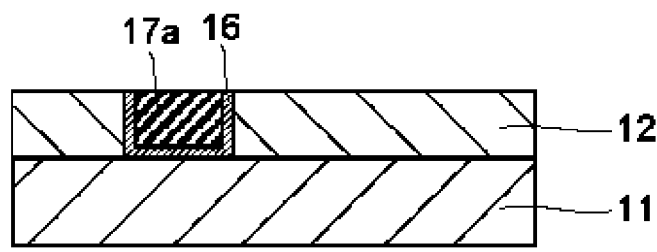
FIG. 4F is a schematic diagram for explaining one example of the method for manufacturing a semiconductor device, and illustrates a state where Cu deposited on the interlayer insulating film is removed apart from the area of the hole pattern.

Thereafter, the titanium film 13 was removed by a wet process, and a TiN film 16 was formed on the interlayer insulating film 12 by sputtering as illustrated in FIG. 4E, followed by forming a Cu film 17 on the TiN film 16 by electroplating. Then, the laminate was flattened by CMP as illustrated in FIG. 4F, with only the barrier metal and the Cu film (the first meal film) remaining in the trench corresponding to the opening 15b (FIG. 4D) to thereby form a wiring 17a of the first layer.

Figure 4G:
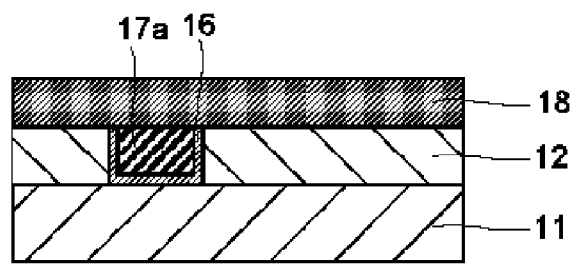
FIG. 4G is a schematic diagram showing one example of the method for manufacturing a semiconductor device, and illustrates a state where an interlayer insulating film is formed on a Cu plug formed in the hole pattern, and on the interlayer insulating film.
Figure 4H:
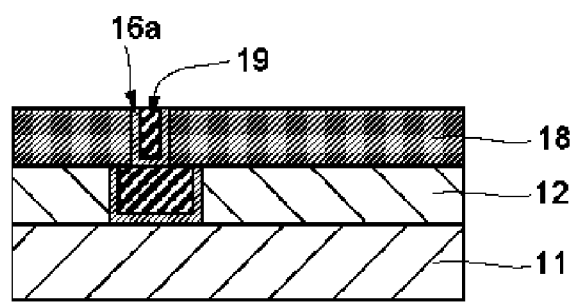
FIG. 4H is a schematic diagram showing one example of the method for manufacturing a semiconductor device, and illustrates a state where a hole pattern is formed in the interlayer insulating film as a surface layer, and a Cu plug is formed.

Sequentially, as illustrated in FIG. 4G, an interlayer insulating film 18 was formed on the wiring 17a of the first layer, and then as illustrated in FIG. 4H a Cu plug (a second metal film) 19, which connects the wiring 17a of the first layer with a wiring of the upper layer formed later, and a TiN film 16a were formed in the same manner as in FIG. 4A to FIG. 4F.

Figure 4I:
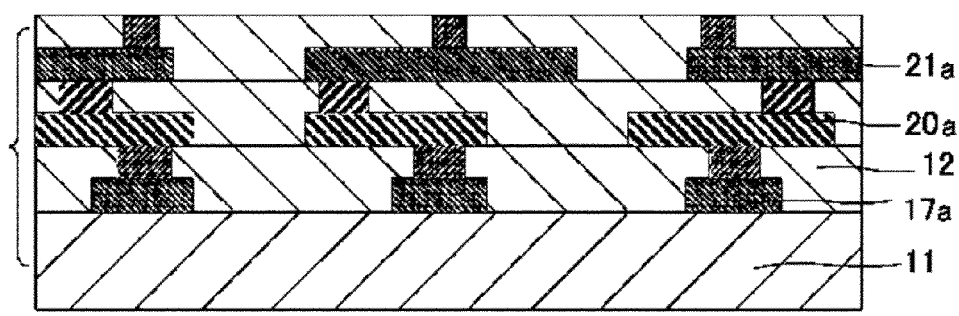
FIG. 4I is a schematic diagram showing one example of the method for manufacturing a semiconductor device, and illustrates a state where a wiring of three-layer structure is formed.

By repeating each of the aforementioned steps, a semiconductor device having a multilayer siring structure including the first layer wiring 17a, the second layer wiring 20a, and the third layer wiring 21a, on the silicon substrate 11 was formed as illustrated in FIG. 4I. Note that a barrier metal layer formed below a wiring of each layer was not illustrated in FIG. 4I.

In Example 13, the resist pattern 14 is a resist pattern formed using a combination of a resist of Example 3 to 6 and 9 to 12 and the coating material. Moreover, interlayer insulating film 12 is a low dielectric material having a dielectric constant of 2.7 or lower, and is, for example, a porous silica film (CERAMATE NCS, manufactured by JGC Catalysts and Chemicals Ltd., dielectric constant: 2.25), or a fluorocarbon film (dielectric constant: 2.4) deposited by RFCVD (powder: 400 W) using $C_4F_8$—$C_2H_2$ mixed gas, or $C_4F_8$ gas as a source.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

The present invention solves various problems in the art, and achieves the aforementioned object.

The coating layer formed on a surface of the first resist pattern prevents the first resist pattern from being dissolved with the second resist composition so that a double resist coating is realized. In addition, the coating layer prevents the first resist pattern being exposed again to exposure light by absorbing the exposure light applied to the second resist film formed of the second resist composition so that a second resist pattern can be formed in the areas of the processing surface where the first resist pattern has not been formed, without deforming the first resist pattern. In this matter, the invention provides a pattern forming method, a method for manufacturing a semiconductor device, and a material for forming a coating layer of a resist pattern, all of which can form, on a processing surface, a pattern having a pattern size exceeding the exposure limit (resolution limit) of the existing exposure light sources.

What is claimed is:

1. A pattern forming method, comprising:
   forming a first resist pattern on a processing surface using a first resist composition;
   forming a coating layer using a coating material so as to cover a surface of the first resist pattern;
   applying a second resist composition over the first resist pattern above which the coating layer has been formed so as not to dissolve the first resist pattern with the second resist composition to thereby form a second resist film; and
   selectively exposing the second resist film to exposure light and developing the second resist film to thereby expose the first resist pattern to the air, as well as forming a second resist pattern in an area of the processing surface where the first resist pattern has not been formed,
   wherein the coating material absorbs the exposure light, and the coating material contains polyparahydroxystyrene, together with 2-hydroxybenzyl alcohol or 4-hydroxybenzyl alcohol or both thereof.

2. The pattern forming method according to claim 1, wherein an amount of 2-hydroxybenzyl alcohol or 4-hydroxybenzyl alcohol or both thereof is 12.5 parts by mass or more relative to 100 parts by mass of the entire resin component contained in the coating material.

3. The pattern forming method according to claim 1, wherein the coating material further contains a solvent, which is at least one selected from the group consisting of an alcohol solvent of C4 or larger, and a glycol solvent of C2 or larger.

4. The pattern forming method according to claim 1, wherein the coating material further contain a surfactant.

5. The pattern forming method according to claim 4, wherein the surfactant contains at least one selected from the group consisting of a polyoxyethylene-polyoxypropylene condensate surfactant, a polyoxyalkylene alkyl ether surfactant, a polyoxyethylene alkyl ether surfactant, a polyoxyethylene derivative surfactant, a sorbitan fatty acid ester surfactant, a glycerin fatty acid ester surfactant, a primary alcohol ethoxylate surfactant, a phenol ethoxylate surfactant, a nonylphenol ethoxylate surfactant, an octylphenol ethoxylate surfactant, a lauryl alcohol ethoxylate surfactant, an oleyl alcohol ethoxylate surfactant, a fatty acid ester surfactant, an amide surfactant, a natural alcohol surfactant, an ethylene diamine surfactant, a secondary alcohol ethoxylate surfactant, a cationic alkyl compound surfactant, a quaternary cationic amide surfactant, a quaternary cationic ester surfactant, an amine oxide surfactant, a betaine surfactant, and a silicone surfactant.

6. The pattern forming method according to claim 4, wherein an amount of the surfactant is 0.005 parts by mass or more relative to 100 parts by mass of the total amount of the coating material.

7. The pattern forming method according to claim 1, wherein the exposure light is ArF excimer laser light having a wavelength of 193 nm.

8. A method for manufacturing a semiconductor device, comprising:
   forming a first resist pattern on a processing surface using a first resist composition;
   forming a coating layer using a coating material so as to cover a surface of the first resist pattern;
   applying a second resist composition over the first resist pattern above which the coating layer has been formed so as not to dissolve the first resist pattern with the second resist composition to thereby form a second resist film; and selectively exposing the second resist film to exposure light and developing the second resist film to thereby expose the first resist pattern, as well as forming a second resist pattern in an area of the processing surface where the first resist pattern has not been formed, wherein the coating material contains polyparahydroxystyrene together with 2-hydroxybenzyl alcohol or 4-hydroxybenzyl alcohol or both thereof.

9. The method for manufacturing a semiconductor device according to claim 8, further comprising etching the processing surface using the first resist pattern and the second resist pattern as a mask to thereby pattern the processing surface.

* * * * *